United States Patent
Yadav et al.

(10) Patent No.: US 11,972,192 B2
(45) Date of Patent: Apr. 30, 2024

(54) SUPERSEDING DESIGN RULE CHECK (DRC) RULES IN A DRC-CORRECT INTERACTIVE ROUTER

(71) Applicant: Synopsys, Inc., Mountain View, CA (US)

(72) Inventors: Praveen Yadav, Bangalore (IN); Philippe McComber, San Jose, CA (US); Anoop C. Nair, Bangalore (IN); Rakesh P. Shenoy, Noida (IN)

(73) Assignee: Synopsys, Inc., Sunnyvale, CA (US)

( * ) Notice: Subject to any disclaimer, the term of this patent is extended or adjusted under 35 U.S.C. 154(b) by 179 days.

(21) Appl. No.: 17/393,079

(22) Filed: Aug. 3, 2021

(65) Prior Publication Data

US 2022/0035986 A1  Feb. 3, 2022

Related U.S. Application Data

(60) Provisional application No. 63/060,368, filed on Aug. 3, 2020.

(51) Int. Cl.
  *G06F 30/394* (2020.01)
  *G06F 30/392* (2020.01)
  *G06F 30/398* (2020.01)

(52) U.S. Cl.
  CPC .......... *G06F 30/398* (2020.01); *G06F 30/392* (2020.01); *G06F 30/394* (2020.01)

(58) Field of Classification Search
  CPC .. G06F 30/398; G06F 2119/18; G06F 30/392; G06F 30/39; G06F 30/20; G06F 30/394; G06F 30/327; G06F 30/3953; G06F 30/3947; G06F 30/30; G06F 2113/18; G06F 30/33; G06F 30/396; G06F 2111/02; G06F 2111/04; G06F 30/13; G06F 30/31; G06F 30/331; G06F 16/532; G06F 2115/12; G06F 2119/22; G06F 3/04842; G06F 30/27; G06F 30/36; G06F 30/367; G06F 2115/08; G06F 30/3308; G06F 30/3323; G06F 2111/12; G06F 2119/06; G06F 2119/20; G06F 30/00; G06F 2119/12; G06F 3/0482;
  (Continued)

(56) References Cited

U.S. PATENT DOCUMENTS 8,966,425 B1 * 2/2015 Eisenstadt ............. G06F 30/394
                                                    716/120
10,521,543 B1 * 12/2019 Saint-Marcel ........ G06F 30/394
(Continued)

*Primary Examiner* — Binh C Tat
(74) *Attorney, Agent, or Firm* — Weaver Austin Villeneuve & Sampson LLP

(57) ABSTRACT

Embodiments provide for interactive routing transistor devices of an integrated circuit (IC) design using an interactive routing tool. An example method includes receiving an integrated circuit (IC) design comprising a plurality of transistor devices. The example method further includes receiving a design rule check (DRC) rules set. The example method further includes, responsive to identifying, based at least in part on the DRC rules set, that a first connection input associated with a transistor device of the plurality of transistor devices creates a design rule violation, determining whether a force mode input has been received. The example method further includes, responsive to determining that the force mode input has been received, enabling routing of the first connection input.

16 Claims, 10 Drawing Sheets

(58) Field of Classification Search
CPC .... G06F 3/0488; G06F 2111/08; G06F 30/18; G06F 2119/02; G06F 16/00; G06F 2117/10; G06F 3/04847; G06F 3/0486; G06F 30/3312; G06F 30/3315; G06F 30/34; G06F 30/373; H01L 27/0886; H01L 21/76895; H01L 21/027; H01L 23/528; H01L 27/0207; H01L 23/522; H01L 23/5226; G03F 1/36; G03F 1/70; G03F 1/38; G03F 7/70433; G03F 7/70441; G03F 7/70; G03F 7/70033
USPC .................................................. 716/110–117
See application file for complete search history.

(56) References Cited

U.S. PATENT DOCUMENTS

| | | | |
|---|---|---|---|
| 10,671,793 B1* | 6/2020 | Deshpande | G06F 30/392 |
| 2013/0074024 A1* | 3/2013 | Chase | G06F 30/398 |
| | | | 716/112 |
| 2017/0286584 A1* | 10/2017 | Lefferts | G06F 30/31 |
| 2018/0121594 A1* | 5/2018 | Studders | G06F 30/398 |

* cited by examiner

SUPERSEDING DESIGN RULE CHECK (DRC) RULES IN A DRC-CORRECT INTERACTIVE ROUTER

CROSS-REFERENCE TO RELATED APPLICATIONS

The present application claims priority to U.S. Provisional Application No. 63/060,368, titled "SUPERSEDING DESIGN RULE CHECK (DRC) RULES IN A DRC-CORRECT INTERACTIVE ROUTER," filed Aug. 3, 2020, the contents of which are incorporated herein by reference in their entirety.

TECHNICAL FIELD

The present application generally relates to an electronic design automation system, and more particularly, to superseding design rule checks (DRC) violations during interactive routing of an integrated circuit (IC) design.

BACKGROUND

A feature in interactive routers in advanced process technologies is the ability to route DRC-correct by construction. With the number of DRC rules increasing with every new process node, if a router prohibits an end user from violating the DRC rules, productivity may be enhanced in certain situations. However, preventing an end user from violating DRC presents many drawbacks. For example, as a layout develops, the end user may want to violate DRC and perform connections and leave the DRCs to be addressed during the final stage of the layout.

SUMMARY

Embodiments are directed to interactive routing transistor devices of an integrated circuit (IC) design using an interactive routing tool. An example method includes receiving an integrated circuit (IC) design comprising a plurality of transistor devices. The example method further includes receiving a design rule check (DRC) rules set. The example method further includes, responsive to identifying, based at least in part on the DRC rules set, that a first connection input associated with a transistor device of the plurality of transistor devices creates a design rule violation, determining whether a force mode input has been received. The example method further includes, responsive to determining that the force mode input has been received, enabling routing of the first connection input. In embodiments, the first connection input comprises a start point and an end point, wherein connecting the start point and the end point creates the design rule violation. In embodiments, the example method further includes generating an interactive routing interface comprising a graphical indication that the first connection input is associated with the design rule violation. In embodiments, the example method further includes receiving a second connection input, and, responsive to identifying that the second connection input complies with the design rules check (DRC) set, enabling routing beyond the second connection input.

In embodiments, the example method further includes receiving the force mode input from an input device.

In embodiments, the design rule violation is a violation of one or more design rules of the design rule check (DRC) set. In embodiments, the interactive routing tool functions in a DRC-correct mode. In embodiments, the force mode input enables the interactive routing tool to function in a DRC-agnostic mode.

In embodiments, the example method further includes receiving an exit force mode input and preventing routing beyond connection inputs that create design rule violations. In embodiments, the exit force mode input enables the interactive routing tool to function in the DRC-correct mode.

In embodiments, the example method further includes storing, in a design repository, a data structure comprising the first connection input and the design rule violation.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
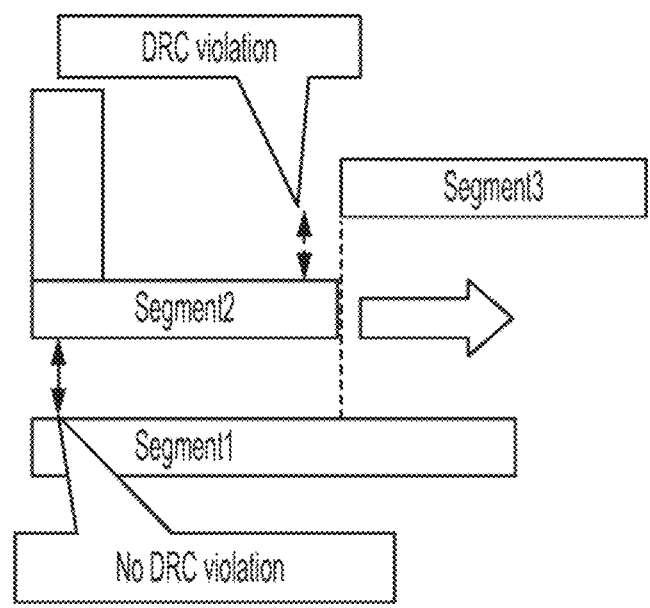
FIG. 1 illustrates an example of routing being prevented beyond a given segment when a DRC violation exists.

Design rule checking (DRC) verifies whether a specific design (e.g., integrated circuit or IC design) meets constraints imposed by a process technology to be used for its manufacturing. DRC is an essential part of a physical design flow and ensures the design meets manufacturing requirements and will not result in a chip failure. Examples of DRC rules include, but are not limited to, minimum width, minimum spacing, minimum area, wide metal job, misaligned via wire, special notch spacing, and end of line spacing.

In the context of integrated circuit (IC) design, routing involves operations where metal connections are made between pins of semiconductor devices to achieve desired functionality. For example, an application in an electronic design automation (EDA) tool that performs routing is called a router.

An absence of the ability to toggle between DRC-correct routing and DRC-agnostic routing within an interactive router poses a serious challenge for usage of DRC-correct interactive routers, including a reduction in the penetration of DRC-correct routers in the industry.

As used herein, a DRC-correct router refers to a router that follows and enforces all DRC rules imposed by a foundry. The DRC-correct router does not continue to allow further routing when DRC violations exist.

As used herein, a DRC-agnostic router refers to a router that does not have DRC awareness. That is, DRC-agnostic refers to ignoring DRC violations. A router operating in DRC-agnostic mode, or a DRC-agnostic router, refers to a router that is configured to ignore DRC violations. DRC-agnostic routers help the end user draw interconnects without providing any feedback on DRC correctness. The end user has an opportunity to take care of (e.g., enforce) the DRC rules on her or his own. Sometimes a DRC-agnostic router may be referred to as an interactive router, a create path feature, or a create interconnect feature.

Embodiments herein provide an interactive routing tool configured to toggle between a DRC-correct mode and a DRC-agnostic mode and methods of using the same. A DRC-correct mode enforces DRC rules associated with a design being routed by way of the interactive tool. A DRC-agnostic mode enables a user to continue routing beyond points in an integrated circuit (IC) design that have been identified as violating a design rule (e.g., a DRC violation exists). Such violated DRCs may be later fixed during the layout finishing stage. A designer may have various reasons for why one or more DRC-violations should be allowed to exist (e.g., or temporarily "ignored" by the routing tool), including timing analysis, anticipation of a change in circuit block(s), and anticipation of different routing of one or more nets at a later time.

Accordingly, a force-mode (e.g., a mode which forces the interactive routing tool to operate in a DRC-agnostic mode or manner) provides a more efficient approach to routing and increases the productivity for performing layout routing because the present force-mode allows a user to continue routing beyond DRC violations. That is, embodiments herein do not block routing when there are DRC violations; instead, embodiments herein allow a user to continue routing despite DRC violations. Further, embodiments herein enable toggling between the two modes (e.g., DRC-agnostic and DRC-correct) easily for the same segment. Finally, embodiments herein provide visual markings of possible violations, enabling the user to decide whether to maintain the violating connection.

As used herein, force-mode refers to a process by which a DRC-correct router is forced to function like a DRC-agnostic router (e.g., the DRC-correct router is forced into a DRC-agnostic mode). That is, the DRC-correct router is instructed to ignore DRC rules while in force-mode. When force-mode is exited, the DRC-correct router is returned its normal (e.g., DRC-correct or DRC-clean) functioning mode where it is aware of and enforces DRC rules.

FIG. 1 illustrates an example of routing being prevented beyond a given segment when a DRC violation exists. A segment, herein, refers to a metal connection made by a router. Shown in FIG. 1, a DRC-correct interactive router does not allow for Segment2 to be routed beyond Segment3 because a DRC violation exists with respect to Segment2.

Figure 2:
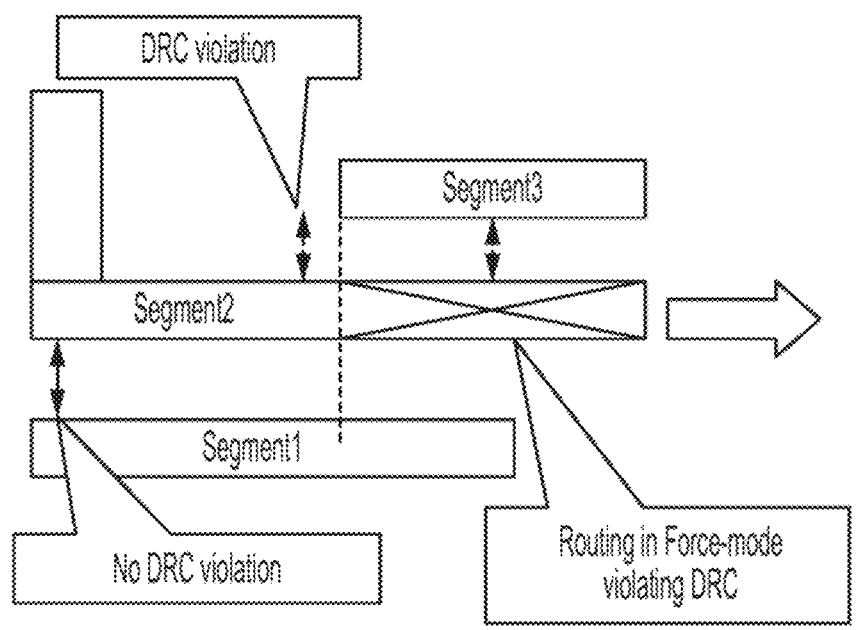
FIG. 2 illustrates an example of superseding DRC rules during interactive routing when a DRC violation exists.

FIG. 2 illustrates an example of superseding DRC rules during interactive routing when a DRC violation exists. In FIG. 2, the same route depicted in FIG. 1 is shown, however, the route can be completed when the DRC-correct router has force-mode enabled (e.g., when the DRC-correct interactive router has force-mode enabled, routing can be completed despite existence of a DRC violation). Accordingly, even though Segment2 has a DRC violation with respect to Segment3, the DRC-correct router shows a graphical indication (e.g., a cross or X) on the segment to indicate the violation, also indicating that the router is not enforcing DRC-correctness. The DRC-correct router then continues to allow routing.

Figure 3:
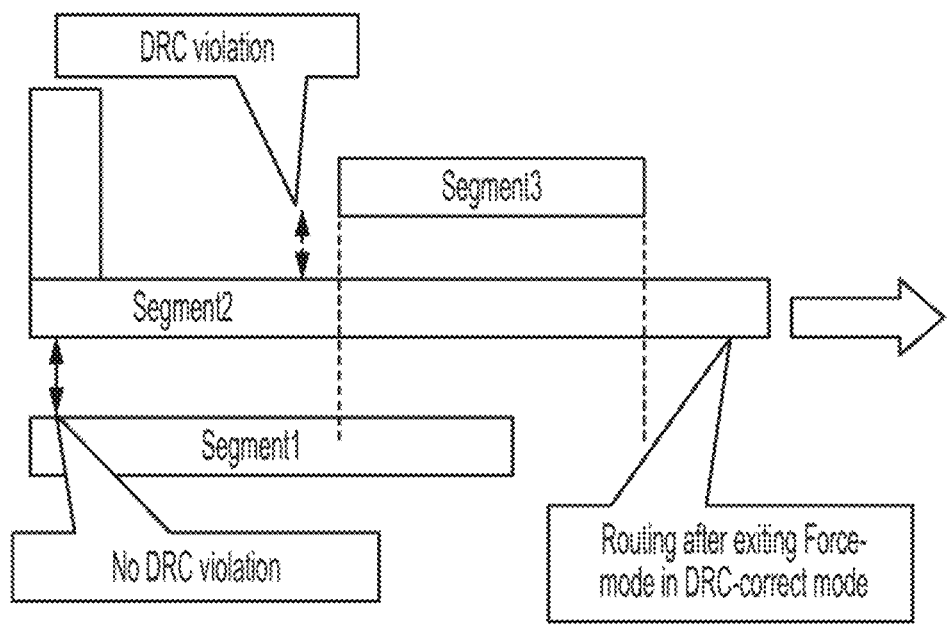
FIG. 3 illustrates an example of returning to compliance with DRC rules during interactive routing after having superseded DRC rules.
Figure 4:
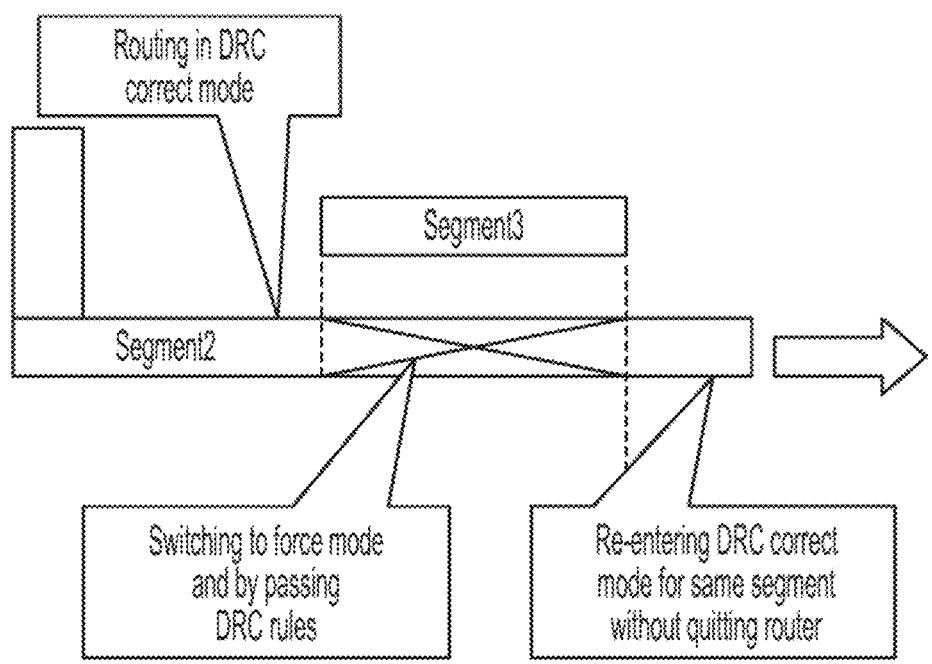
FIG. 4 illustrates an example of returning to compliance with DRC rules during interactive routing after having superseded DRC rules.

FIG. 3 illustrates an example of returning to compliance with DRC rules during interactive routing after having superseded DRC rules. In FIG. 3, force-mode may be exited after the region having the DRC violation (e.g., the region between the two dotted lines) is crossed. Here, force-mode is no longer required because the DRC-correct mode does not prevent routing beyond the second dotted line. In example embodiments, as shown in FIG. 4 a user may toggle between DRC-correct mode and force-mode for the same segment without having to stop routing.

Figure 5:
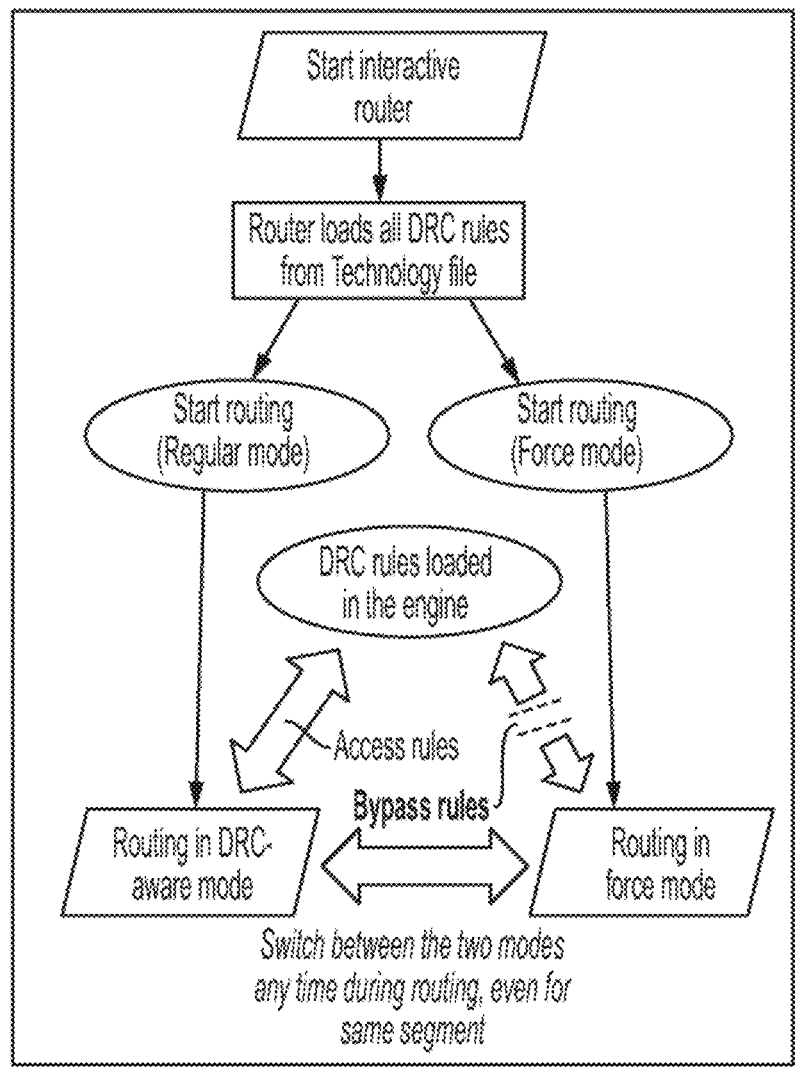
FIG. 5 illustrates a flowchart of example processes used during interactive routing when DRC rules are superseded.

FIG. 5 illustrates a flowchart of example processes used during interactive routing when DRC rules are superseded. Shown in FIG. 5, an interactive router may load all DRC rules from a technology file after being launched. The interactive router may either begin operation in a DRC-correct mode (e.g., regular mode) or a DRC-agnostic mode (e.g., force mode). In the DRC-correct mode, the interactive router accesses DRC rules during routing in order to route in a DRC-aware manner and prevent routing when DRC violations exist. In a force mode, the interactive router bypasses DRC rules in order to provide for routing when DRC violations exist. A user may provide input such that the interactive router is toggled between DRC-correct mode and DRC-agnostic mode. That is, the interactive router is placed in a force-mode which toggles the interactive router out of DRC-correct mode and into DRC-agnostic mode, thereby enabling the interactive router to ignore DRC errors or violations.

Figure 6:
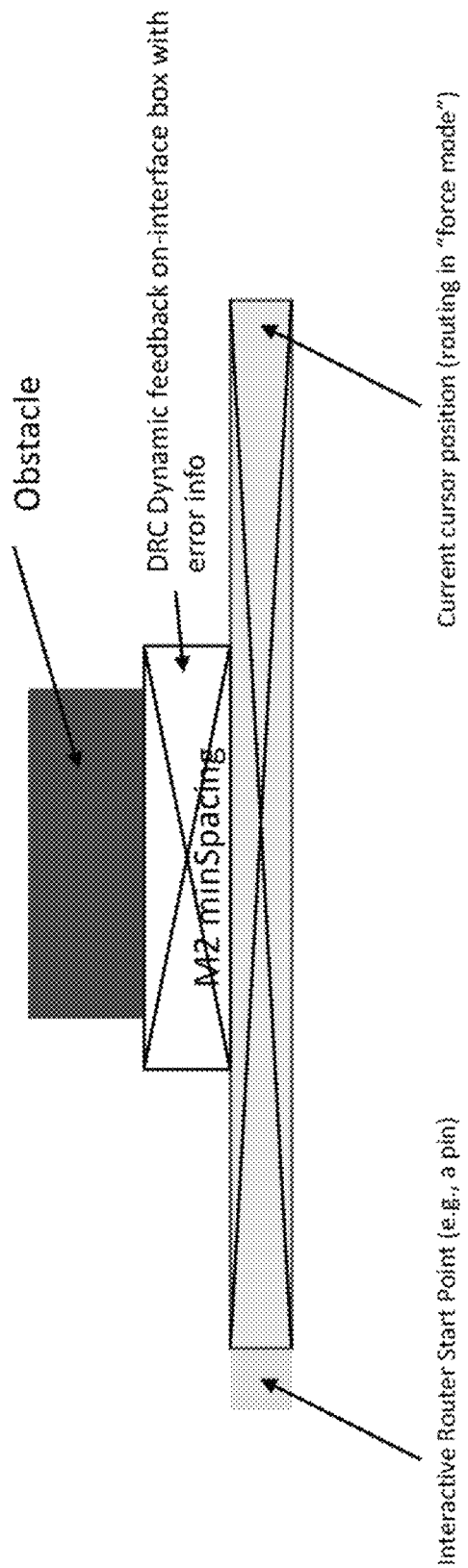
FIG. 6 illustrates an example graphical user interface configuration for use with embodiments of the present disclosure.

FIG. 6 illustrates an example graphical user interface configuration for use with embodiments of the present disclosure. In FIG. 6, an interactive routing tool according to embodiments herein may be operating in a DRC-agnostic mode (e.g., force mode) such that a connection (e.g., from the "Interactive Router Start Point" in FIG. 6 to "Current cursor position" in FIG. 6) that would otherwise violate a DRC rule (e.g., due to "Obstacle" in FIG. 6), may be allowed even though the DRC rule violation exists. Further, shown in FIG. 6, the graphical user interface may be configured such that an indication of the existence DRC rule violation is presented or rendered (e.g., by way of "DRC Dynamic feedback on-interface box" in FIG. 6) as well as an indication or rendering of what the possible DRC rule violation is (e.g., "M2 minSpacing" in FIG. 6). Not only is the present interactive routing tool configured for displaying information related to a possible DRC rule violation created by a given connection while the tool is in DRC-agnostic or force mode, the present interactive routing tool may store one or more data structures associated with a possible DRC rule violation such that a user may retrieve and review the one or more data structures in order to evaluate whether the DRC rule violation needs to be addressed.

Figure 7A:
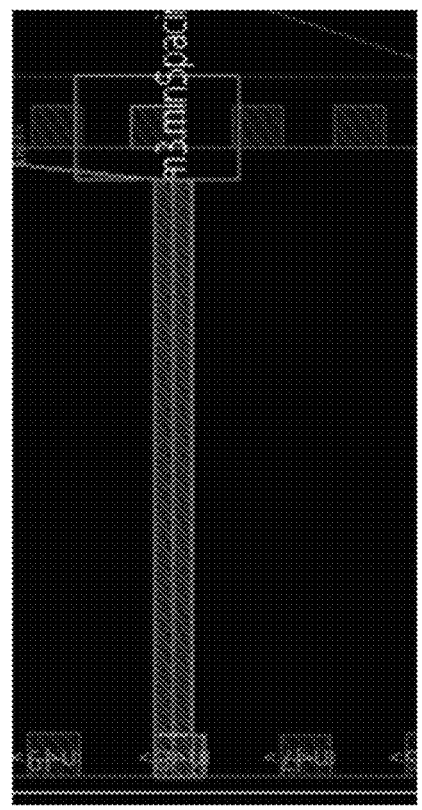
FIG. 7A illustrates an example graphical user interface wherein a DRC rules violation has been ignored, according to embodiments of the present disclosure.
Figure 7B:
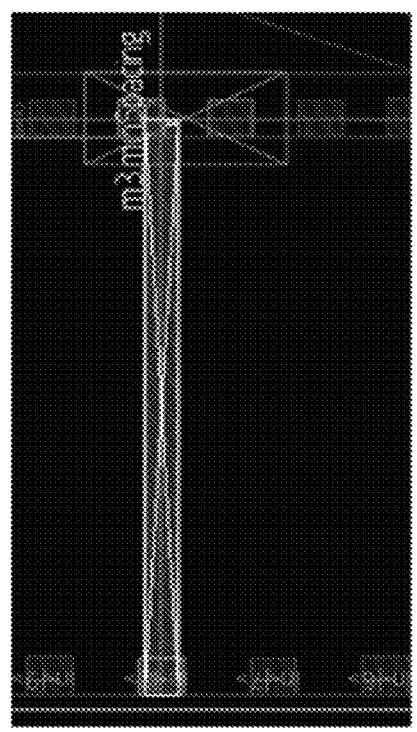
FIG. 7B illustrates an example graphical user interface wherein contour information is displayed, according to embodiments of the present disclosure.

FIG. 7A illustrates an example graphical user interface wherein a DRC rules violation has been ignored (e.g., shown in FIG. 6), according to embodiments of the present disclosure. FIG. 7B illustrates an example graphical user interface wherein contour information is displayed or rendered (e.g., shown in FIG. 6), according to embodiments of the present disclosure.

Figure 8:
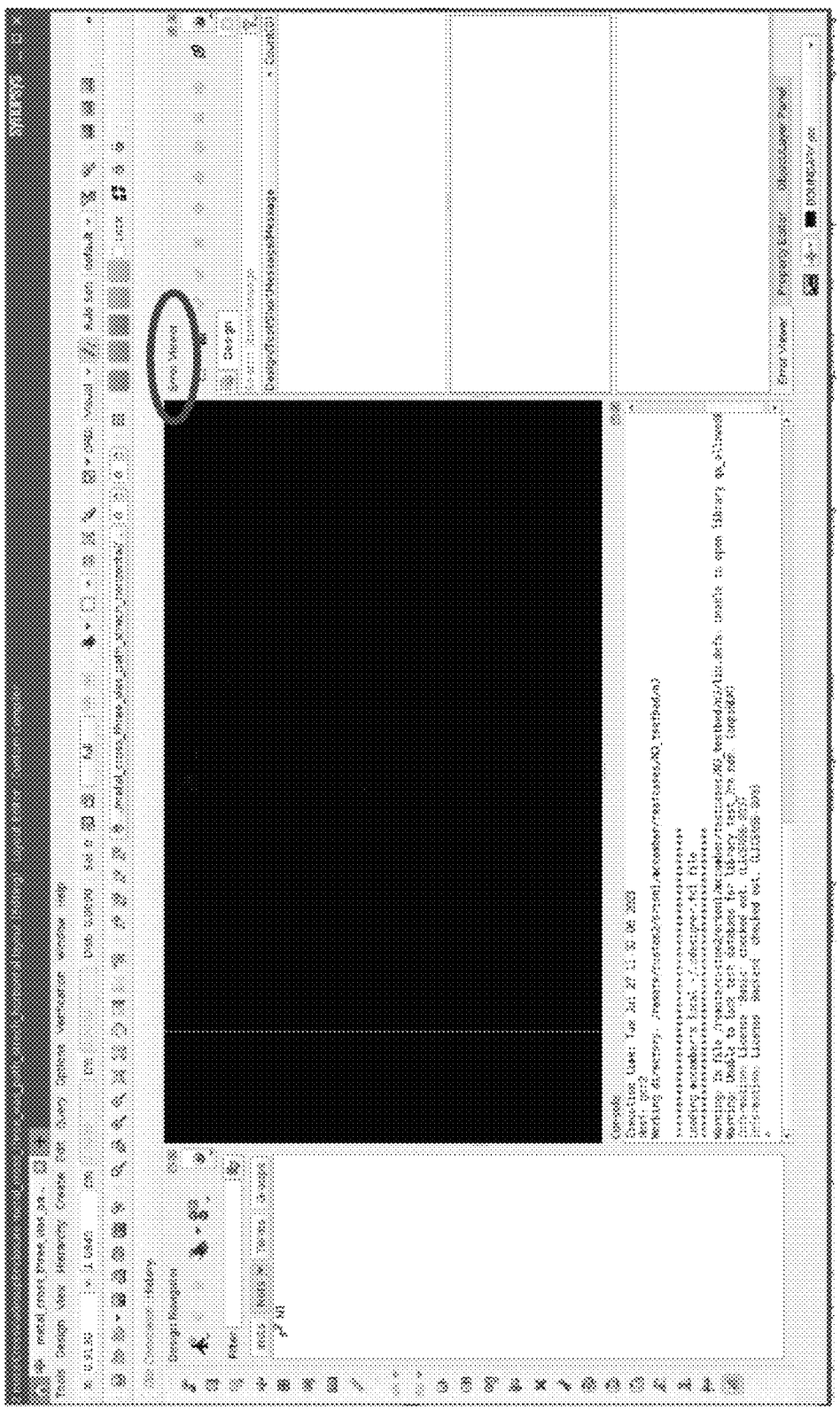
FIG. 8 illustrates an example graphical user interface for use with embodiments of the present disclosure.

FIG. 8 illustrates an example graphical user interface for use with embodiments of the present disclosure. In FIG. 8, an "Error Viewer" provides an interface through which a user may review error markers, where the error markers may include DRC rule violations (e.g., one or more data structures associated with possible DRC rule violations) stored by the interactive tool as described above. That is, when the present interactive routing tool is in force mode and a non-DRC-clean connection (e.g., a connection that violates or possibly violates a DRC rule) is committed to the design repository as mentioned above, an error marker for the non-DRC-clean connection can be saved to the design repository as well so that the error marker can later be reviewed using the "Error Viewer" interface.

As described above, embodiments of the present disclosure provide an efficient mechanism for routing in interactive mode by selectively switching between DRC-correct mode and or force-mode. This will enable end users to use interactive router more efficiently. Force-mode may be enabled by way of a toggle button that can be toggled as soon as the route has passed the violating region. With this feature, the user can continue routing even when there are known DRC violations and can address these violations later during the final finishing of the layout.

Figure 9:
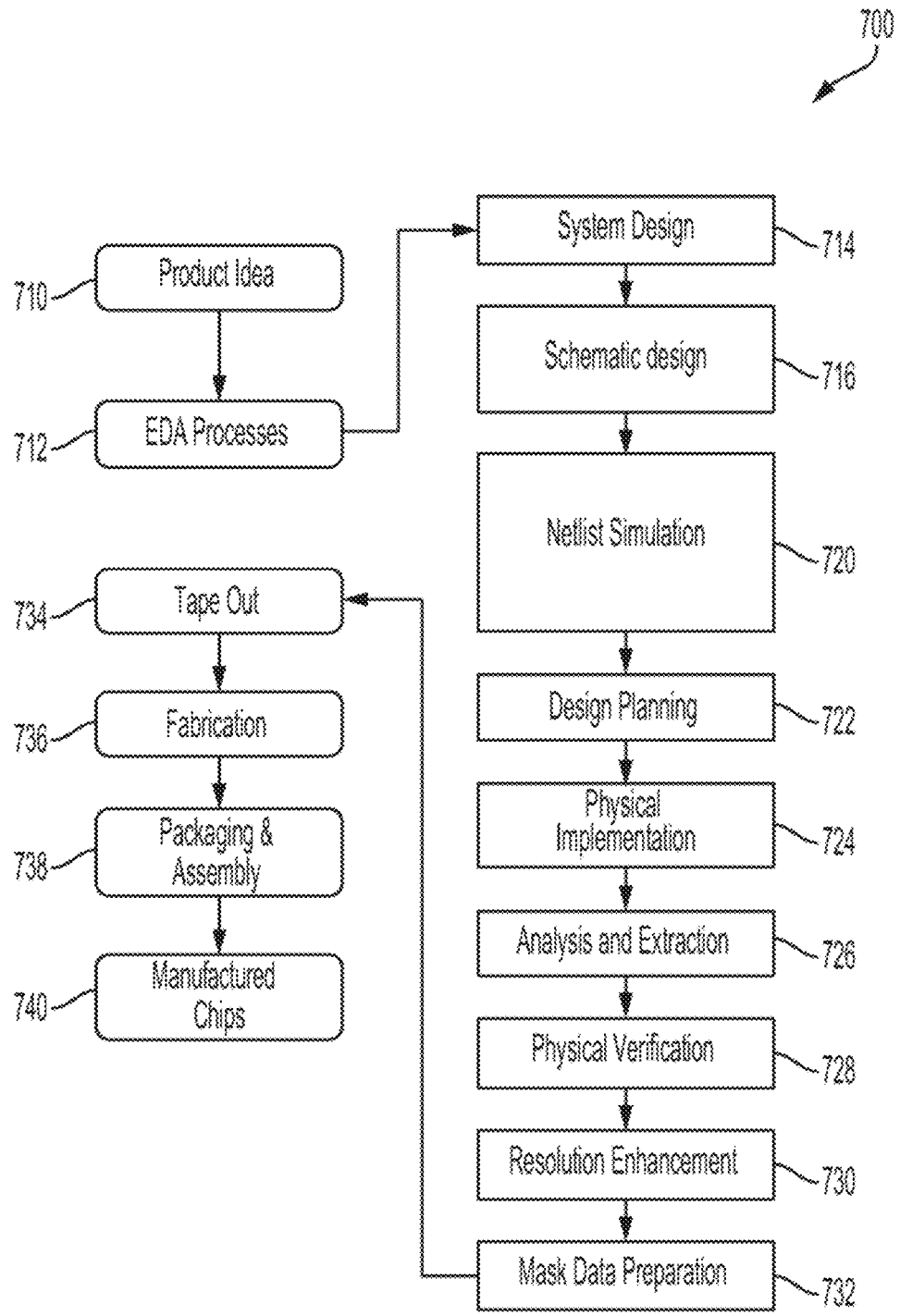
FIG. 9 depicts a flowchart of various operations performed during the design and manufacture of an integrated circuit in accordance with some embodiments of the present disclosure.

FIG. 9 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 10) may be used to store the programs and data structures that are used by some or all of the EDA products described herein, and products used for development of cells for the library and for physical and logical design that use the library.

Figure 10:
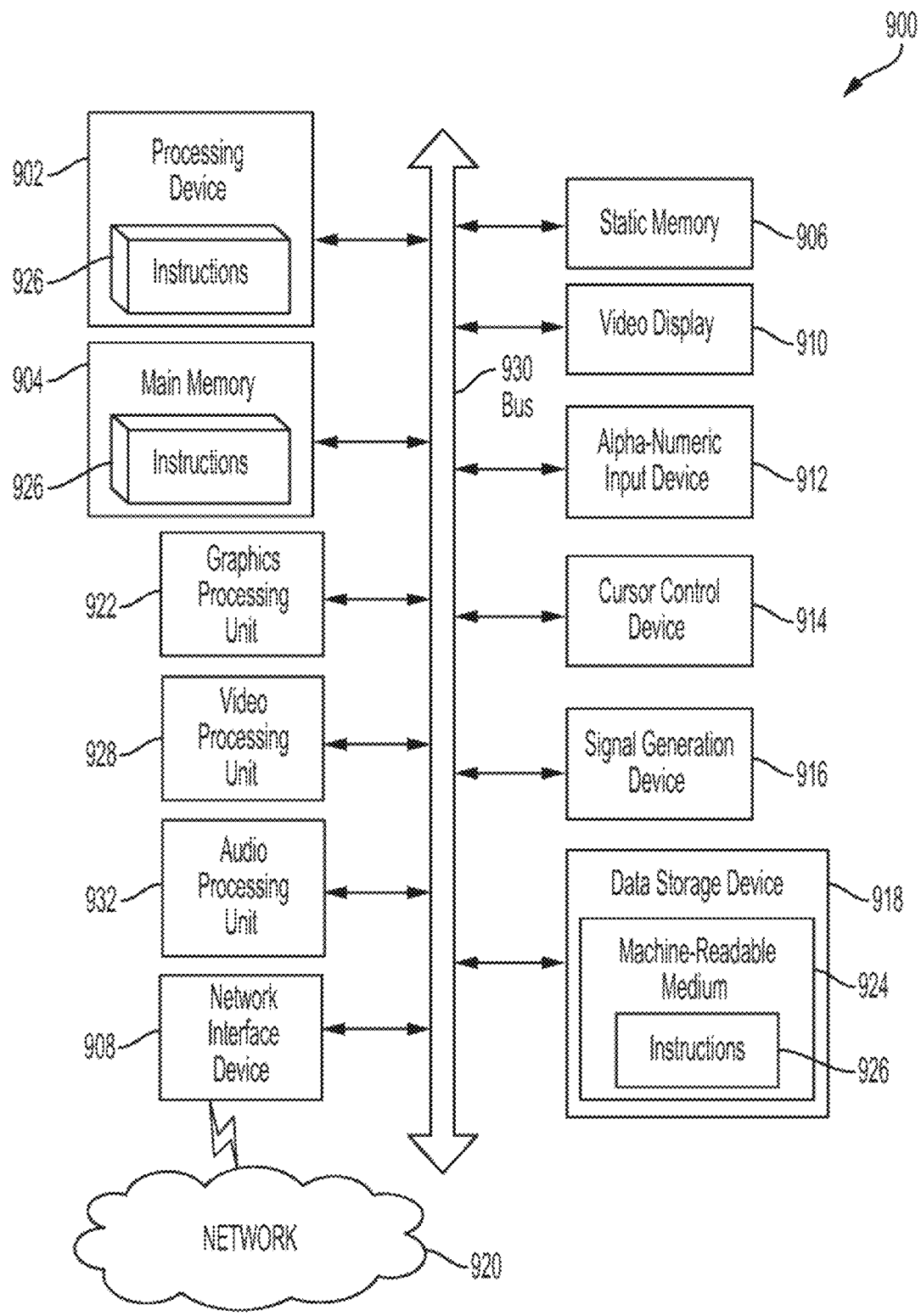
FIG. 10 depicts an example diagram of an example computer system in which embodiments of the present disclosure may operate.

FIG. 10 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for interactive routing of transistor devices of an integrated circuit (IC) design, the method comprising:
   receiving an integrated circuit (IC) design comprising a plurality of transistor devices;
   receiving a design rule check (DRC) rules set;
   routing a segment of a path associated with a first one of the plurality of transistor devices to a first position;
   responsive to identifying, by a processor and based at least in part on the DRC rules set, that routing the segment beyond the first position creates a design rule violation, determining whether a force mode input has been received, wherein a force mode causes the interactive routing to bypass the DRC rules set;
   responsive to determining that the force mode input has been received, enabling the routing of the segment beyond the first position; and
   generating an interactive routing interface comprising a graphical indication that the routing of the segment beyond the first position is associated with the design rule violation.

2. The method of claim 1, further comprising:
   routing the segment to a second position; and
   responsive to identifying that the routing of the segment beyond the second position complies with the design rules check (DRC) set, enabling the routing of the segment beyond the second position.

3. The method of claim 1, further comprising receiving the force mode input from an input device.

4. The method of claim 1, wherein the design rule violation is a violation of one or more design rules of the design rule check (DRC) set.

5. The method of claim 1, wherein the interactive routing tool functions in a DRC-correct mode.

6. The method of claim 5, wherein the force mode input enables the interactive routing tool to function in a DRC-agnostic mode.

7. The method of claim 6, further comprising
   routing the segment to a second position;
   receiving an exit force mode input; and
   preventing routing of the segment beyond the second position if design rule violations are detected.

8. The method of claim 7, wherein the exit force mode input enables the interactive routing tool to function in the DRC-correct mode.

9. The method of claim 1, further comprising:
   storing, in a design repository, a data structure comprising the first segment and the design rule violation.

10. A non-transitory computer-readable medium for storing instructions that, when executed by an apparatus, cause the apparatus to:
    receive an integrated circuit (IC) design comprising a plurality of transistor devices;
    receive a design rule check (DRC) rules set;
    route a segment of a path associated with a first one of the plurality of transistor devices to a first position;
    responsive to identifying, by a processor and based at least in part on the DRC rules set, that routing the segment beyond the first position creates a design rule violation, determine whether a force mode input has been received, wherein the force mode causes the routing to bypass the DRC rules set;
    responsive to determining that the force mode input has been received, enable the routing of the segment beyond the first position; and
    generate an interactive routing interface comprising a graphical indication that the routing of the segment beyond the first position is associated with the design rule violation.

11. The non-transitory computer-readable medium of claim 10, wherein the at least one non-transitory computer storage medium stores instructions that, when executed by the apparatus, further cause the apparatus to:
    route the segment to a second position; and
    responsive to identifying that the routing of the segment beyond the second position complies with the design rules check (DRC) set, enable routing of the segment beyond the second position.

12. The non-transitory computer-readable medium of claim 10, wherein the at least one non-transitory computer storage medium stores instructions that, when executed by the apparatus, further cause the apparatus to:
    receiving the force mode input from an input device.

13. The non-transitory computer-readable medium of claim 10, wherein the design rule violation is a violation of one or more design rules of the design rule check (DRC) set.

14. The non-transitory computer-readable medium of claim 10, wherein the interactive routing tool functions in a DRC-correct mode, and wherein the force mode input enables the interactive routing tool to function in a DRC-agnostic mode.

15. The computer-readable medium of claim 14, wherein the at least one non-transitory computer storage medium stores instructions that, when executed by the apparatus, further cause the apparatus to:
    route the segment to a second position;
    receive an exit force mode input; and
    prevent routing of the segment beyond the second position if design rule violations are detected.

16. A system, comprising at least one processor and at least one non-transitory computer storage medium for storing instructions that, when executed by the at least one processor, cause the system to:
    receive an integrated circuit (IC) design comprising a plurality of transistor devices;
    receive a design rule check (DRC) rules set;

route a segment of a path associated with a first one of the plurality of transistor devices to a first position;

responsive to identifying, by a processor and based at least in part on the DRC rules set, that routing the segment beyond the first position creates a design rule violation, determine whether a force mode input has been received, wherein the force mode causes the routing to bypass the DRC rules set;

responsive to determining that the force mode input has been received, enable the routing of the segment beyond the first position; and generate an interactive routing interface comprising a graphical indication that the routing of the segment beyond the first position is associated with the design rule violation.

* * * * *